(12) United States Patent
Chang et al.

(10) Patent No.: US 11,367,615 B2
(45) Date of Patent: Jun. 21, 2022

(54) METHOD OF FABRICATING TRANSISTOR WITH SHORT GATE LENGTH BY TWO-STEP PHOTOLITHOGRAPHY

(71) Applicant: National Chiao Tung University, Hsinchu (TW)

(72) Inventors: Yi Chang, Hsinchu County (TW); Yueh-Chin Lin, Hsinchu (TW); Po-Sheng Chang, Kaohsiung (TW)

(73) Assignee: National Chiao Tung University, Hsinchu (TW)

( * ) Notice: Subject to any disclaimer, the term of this patent is extended or adjusted under 35 U.S.C. 154(b) by 94 days.

(21) Appl. No.: 16/865,286

(22) Filed: May 1, 2020

(65) Prior Publication Data

US 2021/0151316 A1    May 20, 2021

(30) Foreign Application Priority Data

Nov. 20, 2019   (TW) .................................. 108142207

(51) Int. Cl.
| | | |
|---|---|---|
| *H01L 29/66* | (2006.01) | |
| *H01L 21/027* | (2006.01) | |
| *H01L 29/20* | (2006.01) | |
| *H01L 29/205* | (2006.01) | |
| *H01L 29/778* | (2006.01) | |
| *H01L 21/285* | (2006.01) | |
| *H01L 29/423* | (2006.01) | |

(52) U.S. Cl.
CPC .... *H01L 21/0272* (2013.01); *H01L 21/28581* (2013.01); *H01L 29/2003* (2013.01); *H01L 29/205* (2013.01); *H01L 29/42316* (2013.01); *H01L 29/66462* (2013.01); *H01L 29/7786* (2013.01)

(58) Field of Classification Search
CPC ......... H01L 21/28581; H01L 21/28587; H01L 21/28593; H01L 29/42316; H01L 21/18–2085; H01L 21/027–0338; H01L 21/0272; H01L 29/7786; H01L 29/7787; H01L 29/66462
See application file for complete search history.

(56) References Cited

U.S. PATENT DOCUMENTS

| | | | |
|---|---|---|---|
| 5,905,277 A * | 5/1999 | Ota ................... | H01L 21/28593 257/192 |
| 2003/0025208 A1* | 2/2003 | Makiyama ........ | H01L 29/42316 257/773 |
| 2005/0159009 A1* | 7/2005 | Makiyama .......... | H01L 21/0277 257/E29.127 |
| 2008/0108188 A1 | 5/2008 | Jeong et al. | |
| 2017/0125561 A1* | 5/2017 | Makiyama ............ | H01L 29/517 |

OTHER PUBLICATIONS

Zhu, M. "Nanofabrications of T shape gates for high electron mobility transistors in microwaves and THz waves, a review" Mic. and Nan. Eng. vol. 13, Nov. 2021 100091 pp. 1-18 (Year: 2021).*
Jinhai Shao et al., Nanofabrication of 10-nm T-Shaped Gates Using a Double Patterning Process with Electron Beam Lithography and Dry Etch, Journal of Micro/Nanolithography MEMS, and MOEMS, Sep. 2017, vol. 16(3).

* cited by examiner

*Primary Examiner* — Grant S Withers

(57) ABSTRACT

A method of fabricating transistors with short gate length by two-step photolithography is provided. This method utilizes the two-step photolithography by a stepper as well as controlling a first exposed position and a second exposed position to change the gate length.

15 Claims, 12 Drawing Sheets
(4 of 12 Drawing Sheet(s) Filed in Color)

METHOD OF FABRICATING TRANSISTOR WITH SHORT GATE LENGTH BY TWO-STEP PHOTOLITHOGRAPHY

CROSS-REFERENCE TO RELATED APPLICATION

This application claims priority from Taiwan Patent Application No. 108142207, filed on Nov. 20, 2019 at Taiwan Intellectual Property Office, the disclosures of which are hereby incorporated by reference in their entirety herein.

BACKGROUND

1. Field of the Invention

This invention relates to a method of fabricating transistors by two-step photolithography.

2. Description of the Related Art

The III-V transistors using III-V materials having wide band-gap materials have many advantages, such as high switching speed, high electron mobility, high breakdown field, and wider bandgap. These III-V materials include aluminum gallium nitride (AlGaN), gallium nitride (GaN) and gallium arsenide (GaAs). Thus, these III-V transistors can be used in high-voltage or high-frequency electronic applications, and various researches are initiated to the development of III-V transistors.

For fabricating III-V transistors with short gate length (<150 nm), electron beam (e-beam) lithography is usually used to replace photolithography, since the minimum line width can be formed by using photolithography is about 500 nm. For example, in U.S. Patent Publication No. US 20080108188A1, e-beam photolithography is used to fabricate a T-gate GaN transistor, and the T-gate has the advantage of low parasitic resistance. However, the e-beam lithography can expose only a single gate line at one time and thus has the disadvantages of high cost and long operating time, which makes it difficult to apply the e-beam lithography in mass-production.

SUMMARY

In view of the foregoing, a method of fabricating transistors with short gate length is provided. In this method, two-step photolithography is used to improve the drawbacks of conventional e-beam lithography to increase industrial implementation and utilization.

Accordingly, a method of fabricating a transistor with a short gate length by two-step photolithography. The method comprises the following steps. A source and a drain of the transistor are formed on a wafer. A passivation layer is formed over the source and the drain. A first photoresist layer is formed on the passivation layer. The first photoresist layer is patterned by a first photolithography to expose a portion of the passivation layer, and then the exposed portion of the passivation layer is etched to form a first opening in the passivation layer at a first position between the source and the drain. A second photoresist layer is formed to fill the first opening and cover the passivation layer. The second photoresist layer is then patterned by a second photolithography to form a second opening in the second photoresist layer at a second position to partially expose the first opening and the passivation layer. The first position and the second position are different. A metal layer is formed to fill the second opening and cover the second photoresist layer. The metal layer on the second photoresist layer is lifted-off to form a gate of the transistor in the second opening.

In an embodiment, the transistor is a III-V transistor.

In another embodiment, the gate length of the transistor is determined by an overlapping width of the first opening and the second opening.

In yet another embodiment, the first position is adjustable while the second position is fixed.

In yet another embodiment, the first photoresist layer is further removed after forming the first opening.

In yet another embodiment, the first photoresist layer is removed by dry etching or wet stripping.

In yet another embodiment, the metal layer is lifted-off by removing the second photoresist layer.

In yet another embodiment, the first photolithography and the second photolithography are performed by a stepper.

In addition, another method of fabricating transistors with short gate length by two-step photolithography is also provided. The method comprises the following steps. A plurality of pairs of a source and a drain of the transistors are formed on a wafer. A passivation layer is formed to cover each pair of the source and the drain. A first photoresist layer is formed on the passivation layer. The first photoresist layer is patterned by a first photolithography to expose a plurality of portions of the passivation layer. First openings are respectively formed at first positions each between the source and the drain of each pair by etching the exposed portions of the passivation layer. A second photoresist layer is formed to fill each of the first openings and cover the passivation layer. The second photoresist layer is patterned by a second photolithography to form a plurality of second openings in the second photoresist layer, and each of the second openings is positioned at a second position between the source and the drain of each pair. A metal layer is formed to fill each of the second openings and cover the second photoresist layer. The metal layer on the second photoresist layer is lifted-off to form gates of the transistors respectively in the second openings, wherein a gate length of the transistors is controlled by fixing the second positions, at which the gates are formed, and adjusting the first positions, at which are etched.

In an embodiment, the transistors are III-V transistors.

In another embodiment, the gate length of the transistors each is determined by an overlapping width of the first openings each and the second openings each.

In yet another embodiment, removing the first photoresist layer after forming the first openings.

In still another embodiment, the first photoresist layer is removed by dry etching or wet stripping.

In still another embodiment, the metal layer is lifted-off by removing the second photoresist layer.

In still another embodiment, the first photolithography and the second photolithography are performed by a stepper.

Therefore, by utilizing the two-step photolithography as well as controlling the first position and the second position, the gate length can be adjusted to increase manufacturing efficiency and reduce the costs. Further, the two-step photolithography may be performed by a stepper, so that the drawbacks of the e-beam lithography may be solved.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Advantages and features of the inventive concept and methods of accomplishing the same may be understood more readily by reference to the following description of embodiments together with the accompanying drawings. These embodiments will be described in detail with reference to the accompanying drawings, in which like reference numbers refer to like elements throughout. This invention, however, may be embodied in various of different forms, and should not be construed as being limited to the illustrated embodiments herein. Rather, these embodiments are provided as examples so that this disclosure will be thorough and complete, and will fully convey the aspects and features of this invention to those skilled in the art.

It should be understood that although the terms "first", "second", etc. may be used in this invention to describe various elements, components, regions, layers and/or parts, these elements, components, regions, layers and/or parts should not be limited by these terms. These terms are only used to distinguish one element, component, region, layer and/or part from another element, component, region, layer and/or part. Therefore, the "first element", "first component", "first region", "first layer" and/or "first part" discussed below may be referred to as "second element", "second component", "second region", "second layer" and/or "second part" without departing from the spirit and teachings of this invention.

In addition, the terms "include" and/or "comprise" specify the presence of stated features, integers, steps, operations, elements, and/or components, but do not preclude the presence or addition of one or more other features, integers, steps, operations, elements, components, and/or groups thereof.

Unless defined otherwise, all technical and scientific terms used herein have the same meaning as commonly understood by a person having ordinary skill in the art to which these embodiments belong. It will be further understood that the terms such as those defined in commonly used dictionaries should be interpreted as having definitions consistent with their meaning in the context of the related art and this invention, and will not be interpreted as idealized or overly formal meaning, unless explicitly defined as such in this article.

Figure 1:
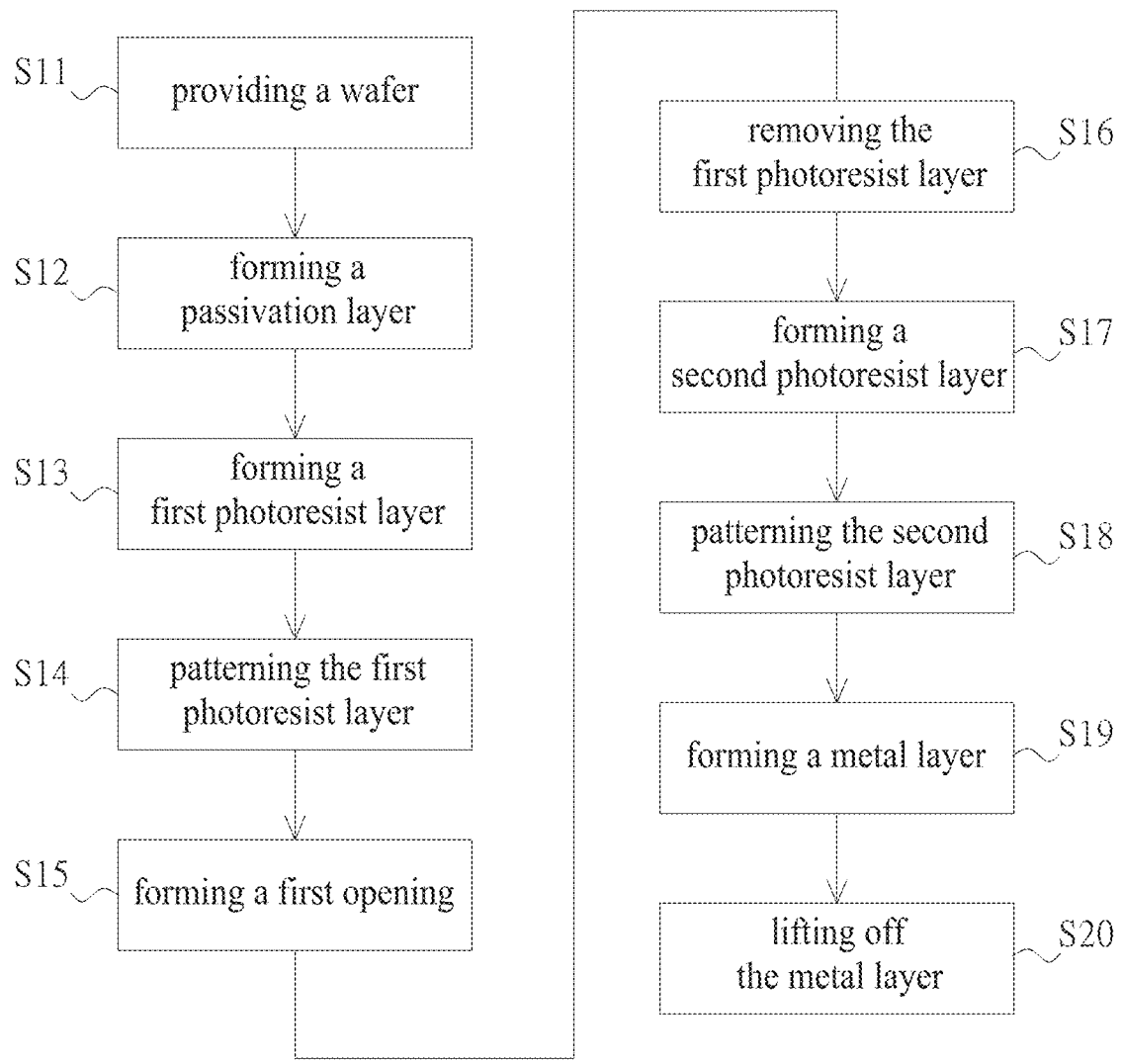
FIG. 1 shows a flow chart diagram of a process of fabricating a transistor with a short gate length by two-step photolithography according to an embodiment of this invention.
Figure 2:
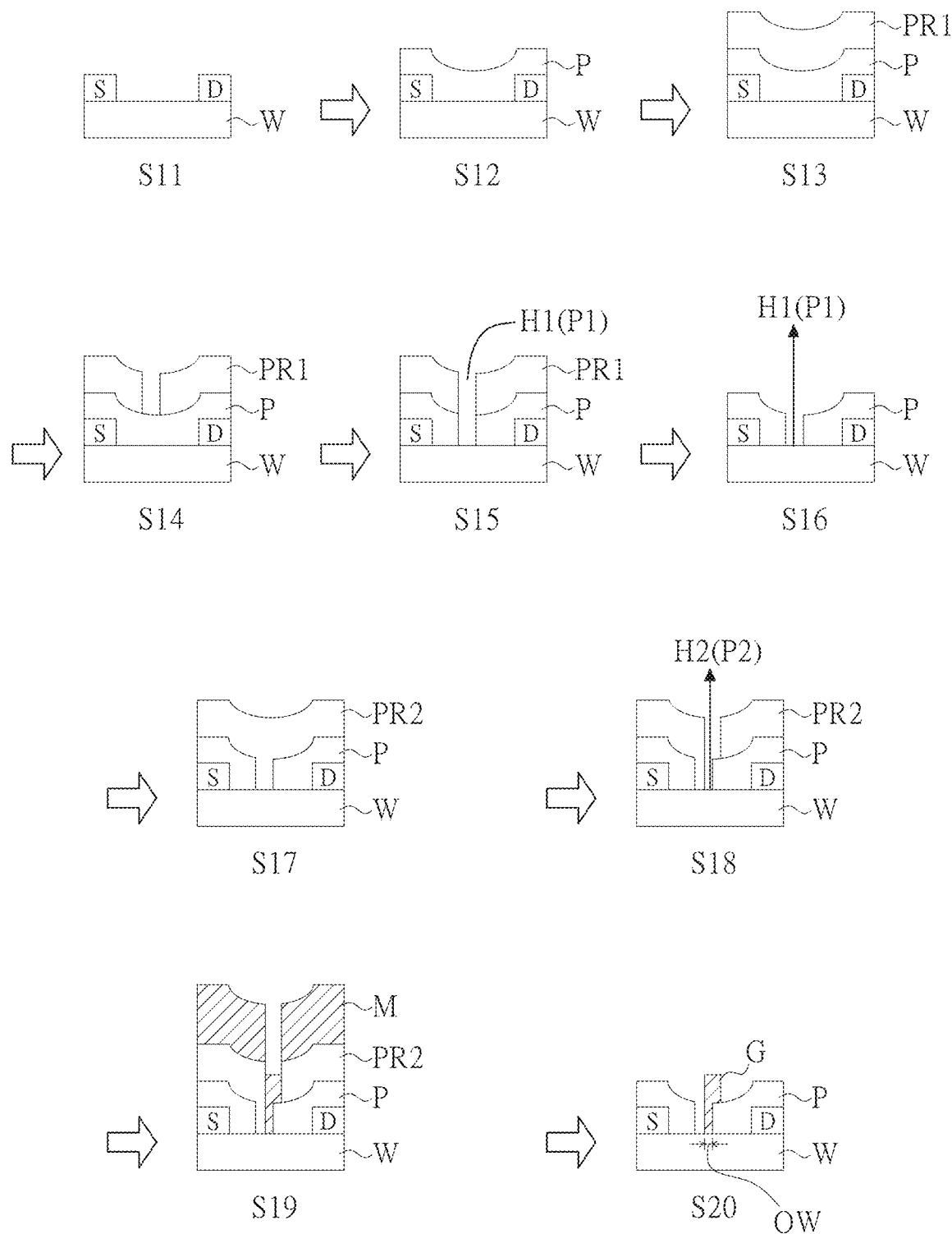
FIG. 2 shows cross-sectional diagrams of a process of a fabricating method of a transistor with a short gate length by two-step photolithography according to the embodiment shown in FIG. 1.

FIGS. 1 and 2 respectively shows a flow chart diagram and cross-sectional diagrams of a process of fabricating a with a short gate length by two-step photolithography according to a first embodiment of this invention. In FIGS. 1 and 2, the method comprises the steps below.

In step S11, a wafer W is provided, and a source S and a drain D are formed on the wafer W. In step S12, a passivation layer P is formed to cover the source S and the drain D. In step S13, a first photoresist layer PR1 is formed on the passivation layer P. In step S14, a first photolithography is performed to pattern the first photoresist layer PR1 to expose a portion of the passivation layer P. The first photolithography may be performed by a stepper, for example. In step S15, the exposed portion of the passivation layer P is etched to form a first opening H1 at a first position P1 to partially expose the wafer W. In step S16, the first photoresist layer PR1 may be removed by dry etching or wet stripping. The dry etching may be plasma etching, such as inductively coupled plasma (ICP) etching.

In step S17, a second photoresist layer PR2 is formed to fill the first opening H1 and cover the passivation layer P. In step S18, a second photolithography is performed to pattern the second photoresist layer PR2 to form a second opening H2 at a second position P2. The second photolithography may be performed by a stepper, for example. In step S19, a metal layer M is formed to fill the second opening H2 and cover the second photoresist layer PR2. In step S20, the metal layer M is lifted-off. Specifically, since the metal layer M covers the second photoresist layer PR2, the metal layer M on the second photoresist layer may be lifted-off by removing the second photoresist layer PR2. Therefore, a gate G is formed in the second opening H2. The line width (i.e. gate length) of the gate G is determined by the overlapping width OW of the first opening H1 and the second opening H2.

Accordingly, two-step photolithography is used to control the overlapping width OW of the first opening H1 and the second opening H2, and the line width of the gate G is thus controlled. In more details, the first position P1 and the second position P2 are at different positions. The first position P1 is adjustable, and the second position P2 is fixed at a position where the gate G is formed. Therefore, the position of the second opening H2 is determined and fixed at first, and the position of the first opening H1 is adjusted depending on the required gate length of the gate G. This means that the distance of the first position P1 and the second position P2 may affect the overlapping width of the first opening H1 and the second opening H2 and thus the line width of the gate G. Hence, a small gate length, such as 0.05-0.25 μm, may be obtained. This small gate length is particularly suitable to be used in a III-V transistor, which usually is used as a high electron mobility transistor (HEMT), such as a gallium nitride (GaN) transistor or a gallium arsenide (GaAs) transistor.

In addition, after completing the steps S11-S20, a protective layer (not shown in FIG. 2) is further formed on the passivation layer P to cover the gate G and the passivation layer P to prevent the wafer W from being affected by exterior impurities or static electricity to protect the wafer W.

The wafer W may be a layered structure comprising at least a substrate of SiC, a channel layer of GaN, a layer of AN, and a barrier layer of AlGaN, from bottom to top sequentially. The transistor above may be a p-type or n-type transistor having a bottom-gate structure, a top-gate structure or a vertical gate structure. Of course, the transistor may also be other suitable transistors and is not limited thereto. The material of the passivation layer P and the protective layer may be silicon oxide ($SiO_x$), silicon nitride ($SiN_x$), silicon oxynitride (SiON), silicon carbonitride (SiCN), silicon oxycarbide (SiOC), aluminum oxide ($AlO_x$) or any combinations thereof, for example. The first photoresist layer PR1 and the second photoresist layer PR2 may be positive or negative photoresist materials, for example. The materials of the metal layer M, the source S, and the drain D may be indium (In), tin (Sn), aluminum (Al), gold (Au), platinum (Pt), zinc (Zn), germanium (Ge), silver (Ag), lead (Pb), palladium (Pd), copper (Cu), gold-beryllium (AuBe), beryllium-germanium (BeGe), nickel (Ni), lead-tin (PbSn), chromium (Cr), gold-zinc (AuZn), titanium (Ti), tungsten (W), tungsten-titanium (TiW), or any combinations thereof, for example. The foregoing materials merely an example list and they may also be other better materials, the materials are thus not limited thereto.

Furthermore, the passivation layer P, the protective layer, the source S, and the drain D may be formed by chemical vapor deposition (CVD), molecular beam epitaxy (MBE), atomic layer deposition (ALD), or sputtering, for example. The thickness of the passivation layer P of silicon nitride ($SiN_x$) is about 50-200 nm, for example. The first photoresist layer PR1 and the second photoresist layer PR2 may be formed by spin coating, for example. Of course, the above layers may be formed by other suitable methods, and the formation methods of the above layers are thus not limited thereto.

Some working examples are described below.

Example 1

Figure 3A:
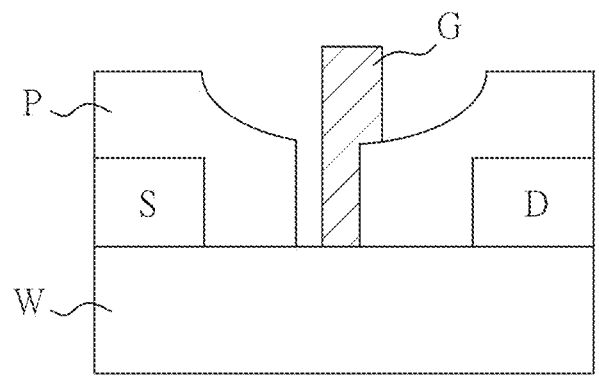
FIG. 3A is a cross-sectional structural diagram of the transistor with a short gate length of about 0.34 μm obtained by the method of FIGS. 1 and 2.
Figure 3B:
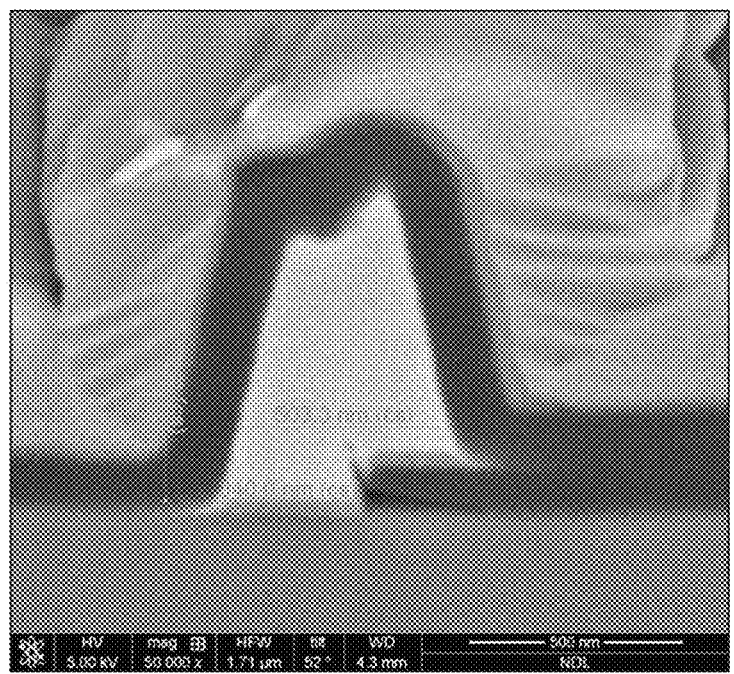
FIG. 3B is a scanning electron microscopic image of the transistor in FIG. 3A.

FIG. 3A is a cross-sectional structural diagram of the transistor with a short gate length of about 0.34 μm obtained by the method of FIGS. 1 and 2, and FIG. 3B is a scanning electron microscopic image of the transistor in FIG. 3A. In this example, an AlGaN/GaN high electron mobility transistor (HEMT) was fabricated. In FIG. 3A, the distance between the source S and the drain D was 4 μm. The distance between the first position P1 and the source S was 1.5 μm. From the first position P1, the second position P2 was shifted toward the drain D by 0.15 μm. The thickness of the passivation layer P of silicon nitride was about 0.15 μm. However, when the passivation layer P is etched, a lateral etching is usually occurred. Therefore, the diameter of the first opening H1 was thus expanded outward by an amount equal to about the thickness of the passivation layer, i.e. 0.15 μm. In addition, the metal outward expansion of the gate G was about 0.04 μm. Hence, the actual line width of the gate G was increased to about 0.34 μm in FIG. 3B.

Figure 4:
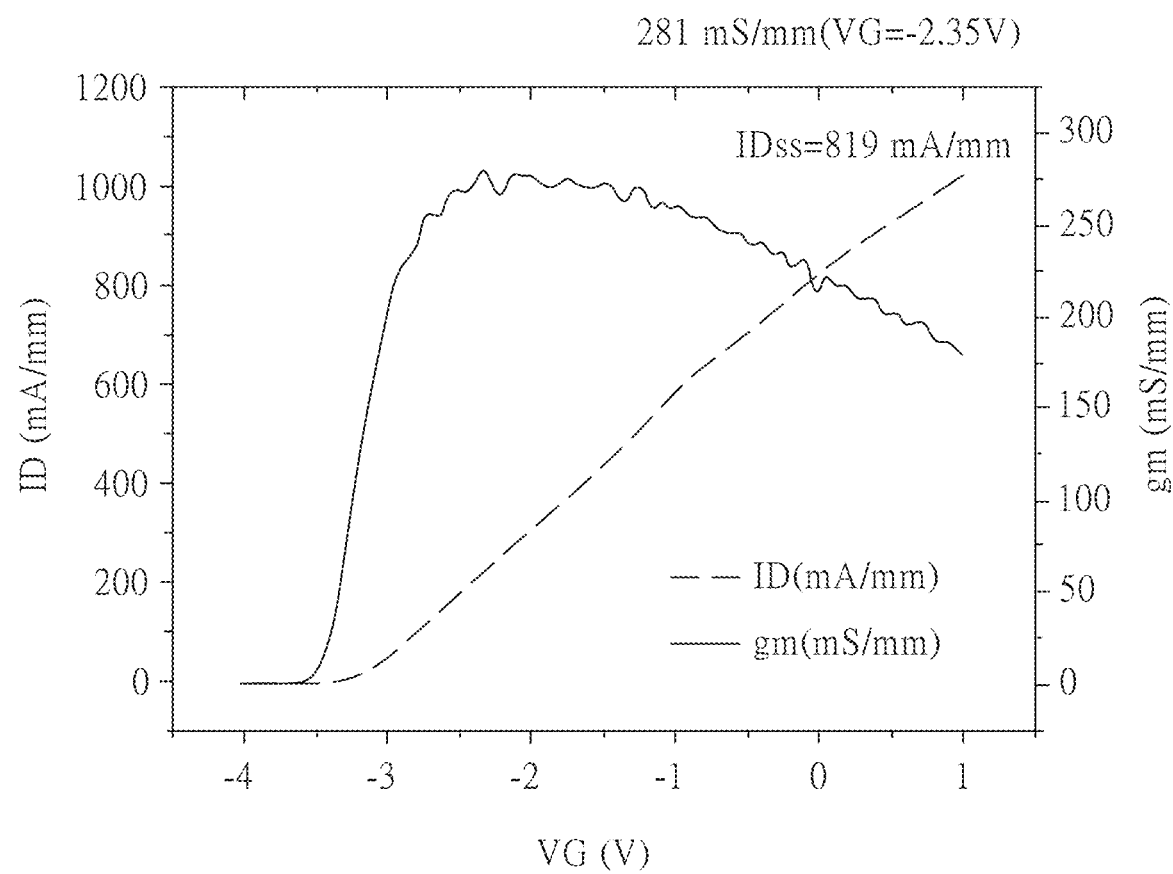
FIG. 4 is a diagram showing curves of drain current ID vs. gate voltage VG and transconductance gm vs. gate voltage VG of the transistor in FIGS. 3A and 3B.

FIG. 4 is a diagram showing curves of drain current ID vs. gate voltage VG and transconductance gm vs. gate voltage VG of the transistor in FIGS. 3A and 3B. In FIG. 4, the drain current ID and the gate voltage VG are approximately in a linear relation. The higher the gate voltage VG was, the higher the drain current ID was. When the gate voltage VG was −2.35 V, the transconductance gm of the transistor was 281 mS/mm. When the gate voltage VG was 0 V, the saturation drain current IDss was 819 mA/mm.

Example 2

Figure 5A:
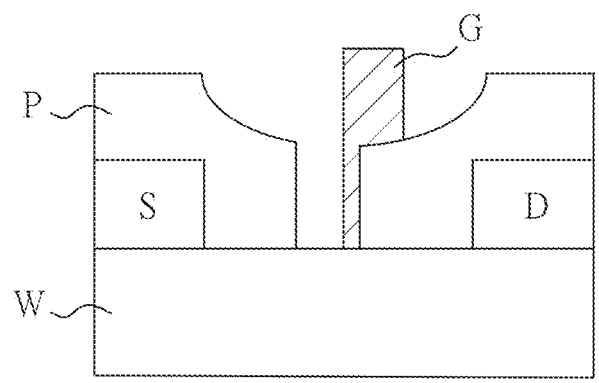
FIG. 5A is a cross-sectional structural diagram of the transistor with a short gate length of about 0.10 μm obtained by the method of FIGS. 1 and 2.
Figure 5B:
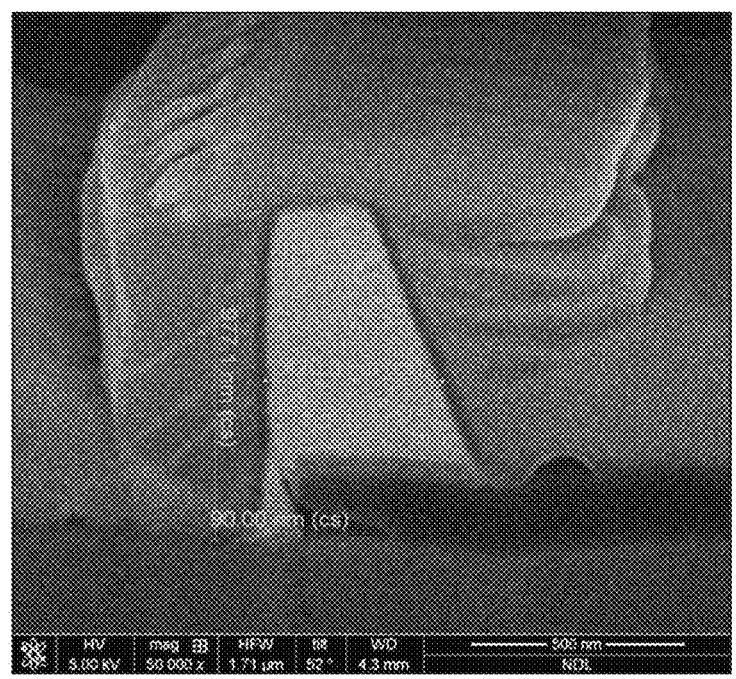
FIG. 5B is a scanning electron microscopic image of the transistor in FIG. 5A.

FIG. 5A is a cross-sectional structural diagram of the transistor with a short gate length of about 0.10 μm obtained by the method of FIGS. 1 and 2, and FIG. 5B is a scanning electron microscopic image of the transistor in FIG. 5A. In this example, an AlGaN/GaN HEMT was also fabricated. In FIG. 5A, the distance between the source S and the drain D was also 4 μm. The distance between the first position P1 and the source S was also 1.5 μm. From the first position P1, the second position P2 was shifted toward the source S by about 0.03 μm. The thickness of the passivation layer P of silicon nitride was also about 0.15 μm. Finally, since the passivation layer P was laterally etched, the actual gate length of the gate G was increased to about 0.1 μm in FIG. 5B.

Figure 6A:
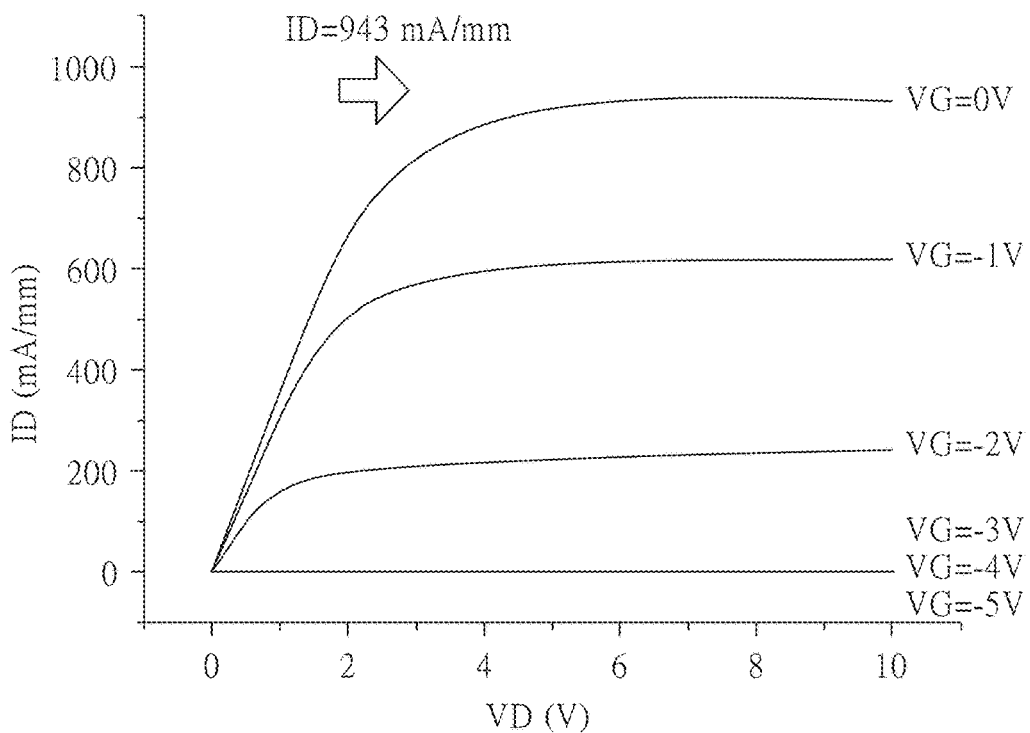
FIG. 6A is a diagram showing curves of drain voltage VD vs. drain current ID at different gate voltage VG of the transistor in FIGS. 5A and 5B.
Figure 6B:
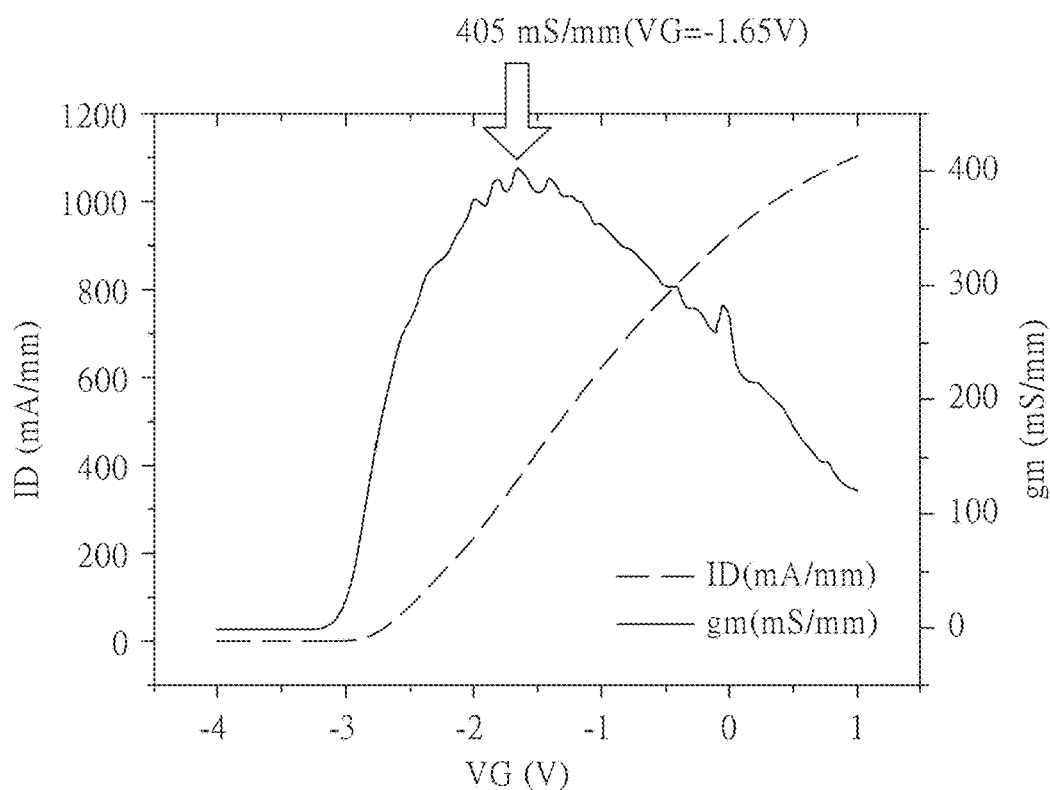
FIG. 6B is a diagram showing curves of drain current ID vs. gate voltage VG and transconductance gm vs. gate voltage VG of the transistor in FIGS. 5A and 5B.

FIG. 6A is a diagram showing curves of drain voltage VD vs. drain current ID at different gate voltage VG of the transistor in FIGS. 5A and 5B. In FIG. 6A, when the gate voltage VG was 0 V, the saturation drain current IDSS was 943 mA/mm. FIG. 6B is a diagram showing curves of drain current ID vs. gate voltage VG and transconductance gm vs. gate voltage VG of the transistor in FIGS. 5A and 5B. In FIG. 6B, the drain current ID and the gate voltage VG are approximately in linear relation. The higher the gate voltage VG was, the higher the drain current ID was. When the gate voltage VG was −1.65 V, the transconductance gm of the transistor was 405 mS/mm.

Accordingly, a transistor of a gate with a line width or about 0.10-0.34 μm can be obtained by using two-step photolithography performed by a stepper.

Example 3

In this example, the conditions are the same as the Example 1, except for that the second position P2 was shifted toward the drain D by 0.09 μm from the first position P1. The obtained actual gate length of the gates G was about 0.22 μm.

Figure 7A:
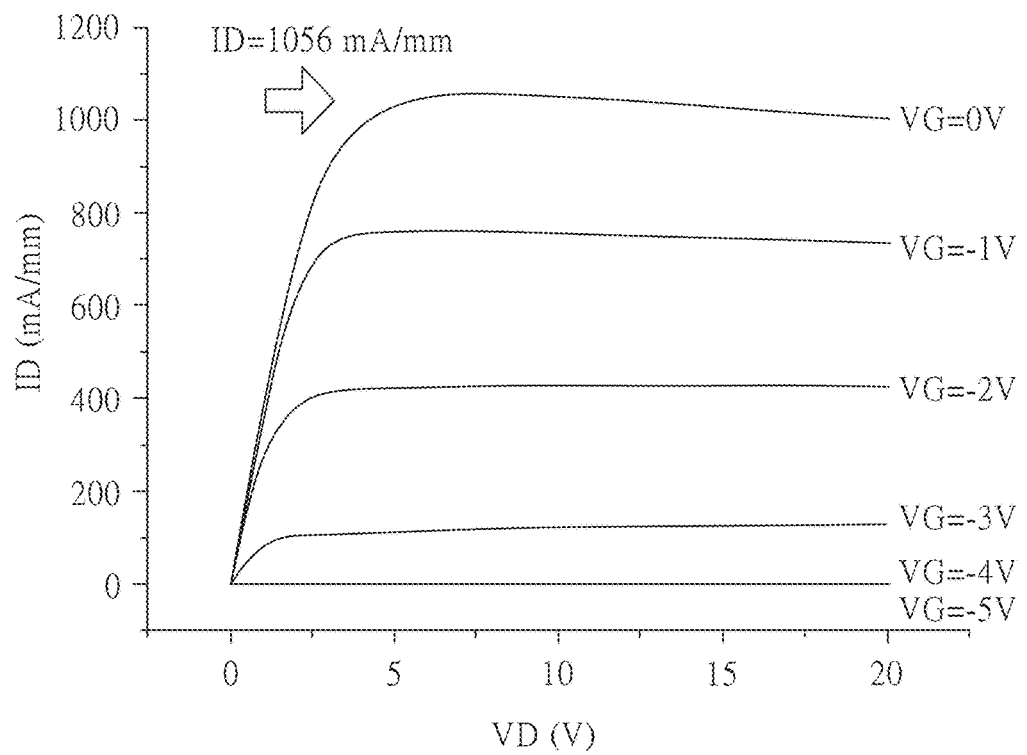
FIG. 7A is a diagram showing curves of drain voltage VD vs. drain current ID at different gate voltage VG of the transistor with a short gate length of about 0.22 μm obtained by the method of FIGS. 1 and 2.
Figure 7B:
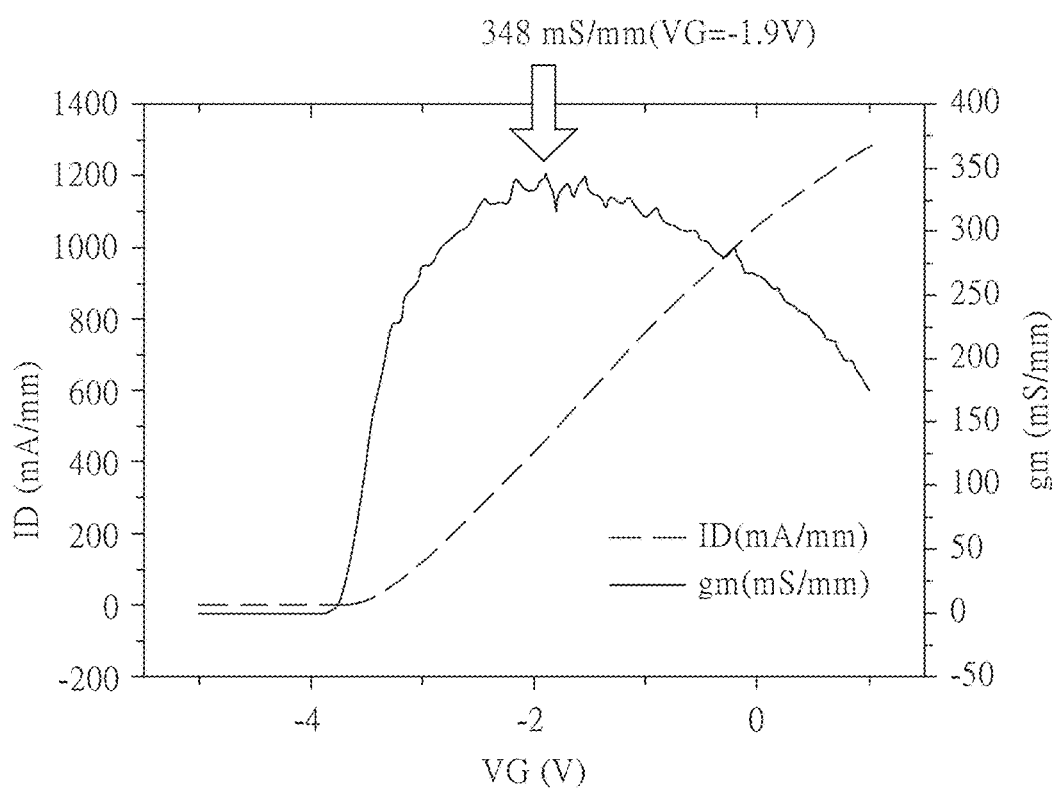
FIG. 7B is a diagram showing curves of drain current ID vs. gate voltage VG and transconductance gm vs. gate voltage VG of the transistor with a short gate length of about 0.22 μm obtained by the method of FIGS. 1 and 2.

FIG. 7A is a diagram showing curves of drain voltage VD vs. drain current ID at different gate voltage VG of the transistor with a short gate length of about 0.22 μm obtained by the method of FIGS. 1 and 2. In FIG. 7A, when the gate voltage VG was 0 V, the saturation drain current IDss was 1056 mA/mm. FIG. 7B is a diagram showing curves of drain current ID vs. gate voltage VG and transconductance gm vs. gate voltage VG of the transistor with a short gate length of about 0.22 μm obtained by the method of FIGS. 1 and 2. In FIG. 7B, the drain current ID and the gate voltage VG are approximately in linear relation. The higher the gate voltage VG was, the higher the drain current ID was. When the gate voltage VG was −1.9 V, the transconductance gm of the transistor was 348 mS/mm.

Figure 8:
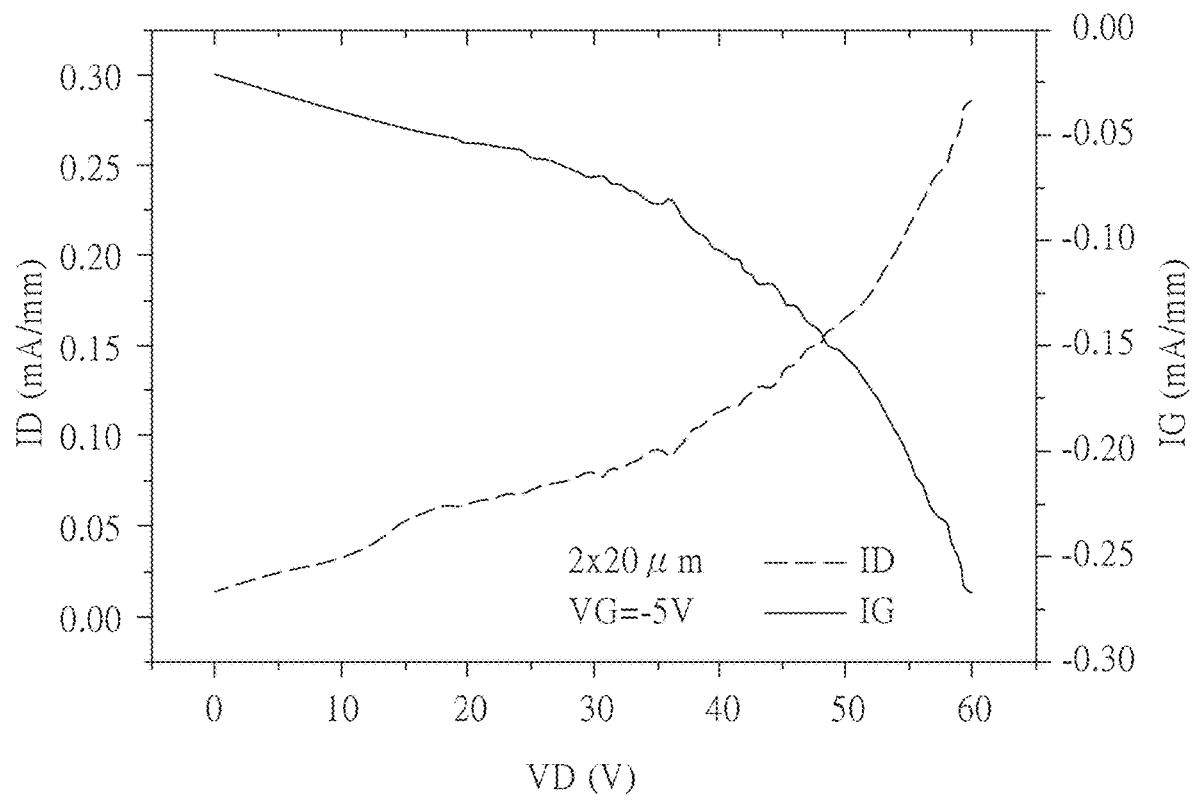
FIG. 8 is a diagram showing curves of drain current ID vs. drain voltage VD and gate current IG vs. drain voltage VD of the transistor with a short gate length of about 0.10 μm obtained by the method of FIGS. 1 and 2.

FIG. 8 is a diagram showing curves of drain current ID vs. drain voltage VD and gate current IG vs. drain voltage VD of the transistor with a short gate length of about 0.10 μm obtained by the method of FIGS. 1 and 2. In FIG. 8, when the gate voltage VG was −5 V, as the drain voltage VD was increased from 0 V to 60 V, the drain current ID was positive and increased, but the gate current IG was negative and decreased. When the drain voltage VD was zero, the drain current ID was about 0.02 mA/mm, and the gate current IG was about −0.025 mA/mm. When the voltage VD of drain was 60 V, the current of the drain D was about 0.28 mA/mm, and the current of the gate G was about −0.27 mA/mm.

Figure 9A:
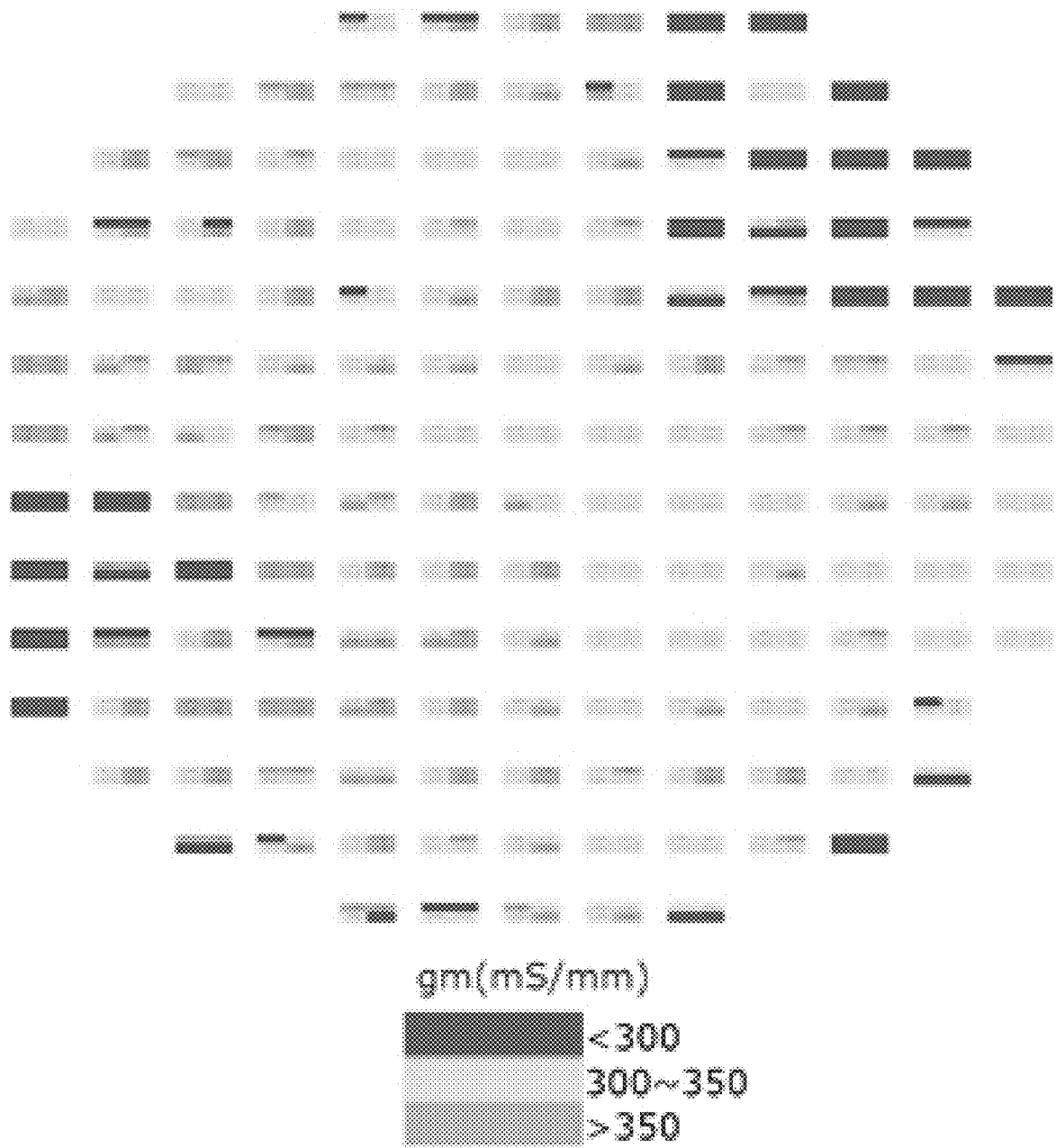
FIGS. 9A and 9B are diagrams showing the transconductance distribution of the transistors with a short gate length of about 0.22 μm on a wafer obtained by the method of FIGS. 1 and 2.
Figure 9B:
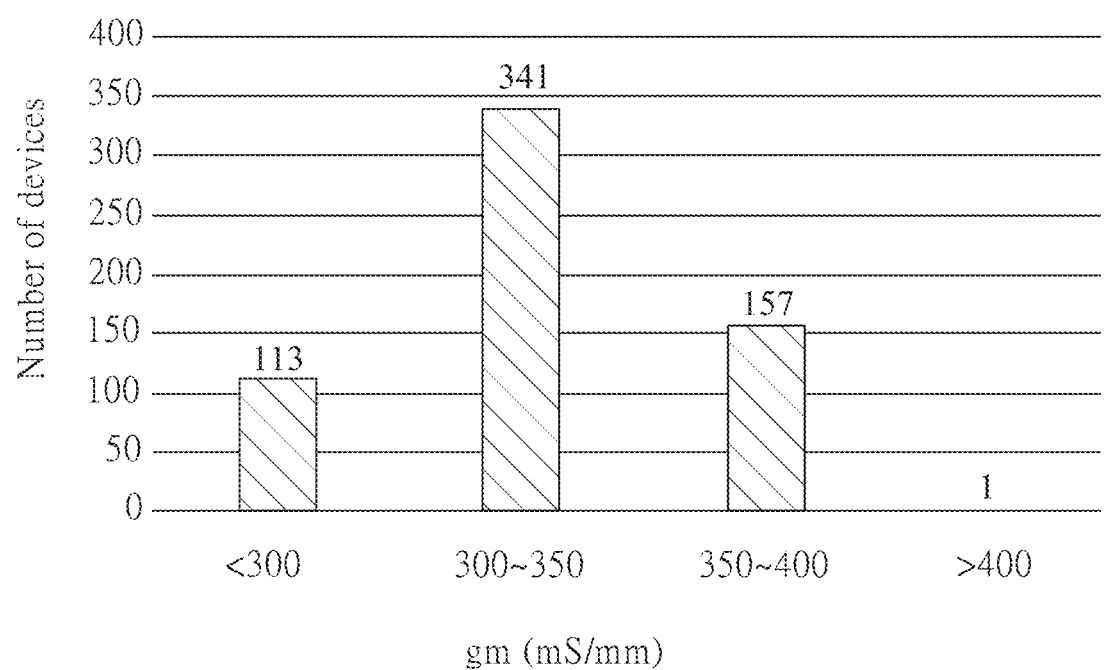
Figure 10A:
FIGS. 10A and 10B are diagrams showing the drain saturation current distribution of transistors with a short gate length of about 0.22 μm on a wafer obtained by the method of FIGS. 1 and 2.
Figure 10B:
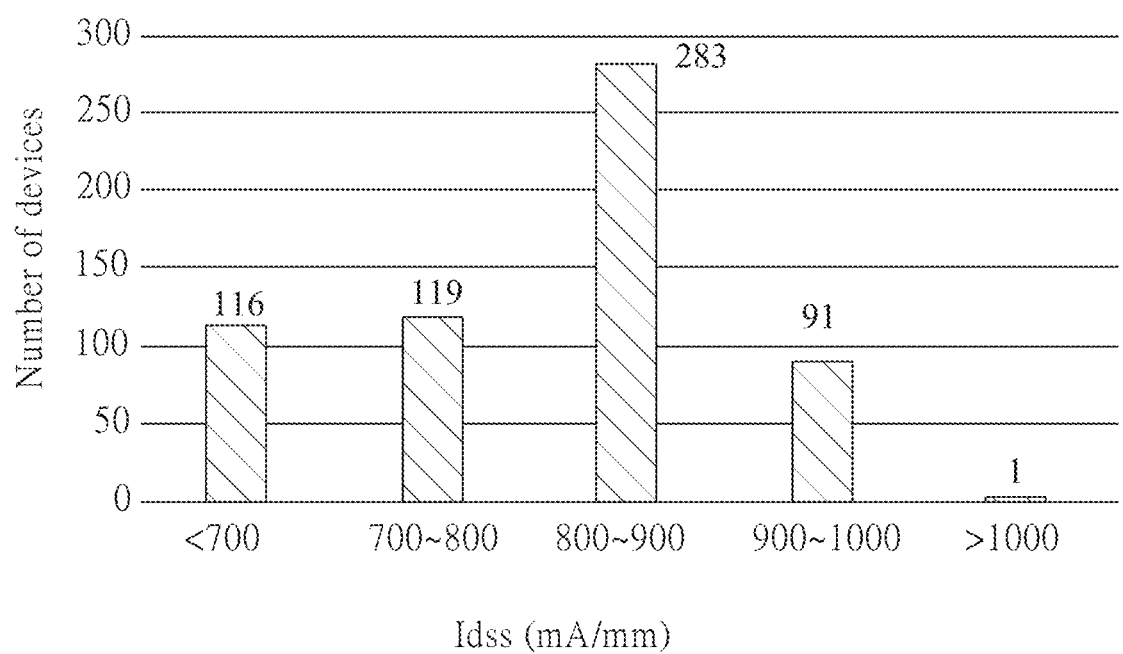

FIGS. 9A and 9B are diagrams showing the transconductance distribution of the transistors with a short gate length of about 0.22 μm on a wafer obtained by the method of FIGS. 1 and 2. In FIG. 9A, the transconductance gm of the transistors on the wafer was divided into three groups marked by different colors. The three groups are <300 mS/mm, 300-350 mS/mm, and >350 mS/mm, and the statistical numbers thereof is shown in FIG. 9B. FIGS. 10A and 10B are diagrams showing the drain saturation current distribution of transistors with a short gate length of about 0.22 μm on a wafer obtained by the method of FIGS. 1 and 2. Similarly, in FIG. 10A, the saturation drain current Idss at zero gate voltage of the transistors on the wafer was also divided into three groups marked by different colors. The three groups are <800 mA/mm, 800-900 mA/mm, and >900 mA/mm, and the statistical numbers thereof is shown in FIG. 10B. According to the distributions of the transconductance gm and the saturation drain current Idss, it was known that each transistor has similar electrical characteristics in the central part of the wafer. This means that the overall process was quite uniform and stable.

As mentioned above, the method of manufacturing high electron mobility transistors with short gate length by two-step photolithography is used to control the line width (i.e. the gate length) of the gate of transistors. In this method, two partially overlapping openings (i.e. the first and the second openings) are formed. Hence, the overlapping width of the first opening and the second opening determines the line width of the gate. Moreover, since a stepper may be used to perform the two-step photolithography, the manufacturing efficiency is greatly increased, and the cost is thus decreased.

The previous description of the preferred embodiments is provided to further describe this invention, not intended to limit this invention. Any modification apparent to those skilled in the art according to the disclosure within the scope will be construed as being included in this invention.

What is claimed is:

1. A method of fabricating a transistor with a short gate length by two-step photolithography, the method comprising:
    forming a source and a drain of the transistor on a wafer;
    forming a passivation layer over the source and the drain;
    forming a first photoresist layer on the passivation layer;
    patterning the first photoresist layer by a first photolithography to expose a portion of the passivation layer;
    forming a first opening in the passivation layer at a first position between the source and the drain by etching the exposed portion of the passivation layer;
    forming a second photoresist layer to fill the first opening and cover the passivation layer;
    patterning the second photoresist layer by a second photolithography to form a second opening in the second photoresist layer at a second position to partially expose the first opening and the passivation layer, wherein the second position is different from the first position;
    forming a metal layer to fill the second opening and cover the second photoresist layer; and
    lifting-off the metal layer on the second photoresist layer to form a gate of the transistor in the second opening.

2. The method of claim 1, wherein the transistor is a III-V transistor.

3. The method of claim 1, wherein a gate length of the gate is determined by an overlapping width of the first opening and the second opening.

4. The method of claim 1, wherein the first position is adjustable while the second position is fixed.

5. The method of claim 1, further comprising removing the first photoresist layer after forming the first opening.

6. The method of claim 5, wherein the first photoresist layer is removed by dry etching or wet stripping.

7. The method of claim 1, wherein the metal layer is lifted-off by removing the second photoresist layer.

8. The method of claim 1, wherein the first photolithography and the second photolithography are performed by a stepper.

9. A method of fabricating transistors by two-step photolithography, the method comprising:
    forming a plurality of pairs of sources and drains of the transistors on a wafer;
    forming a passivation layer to cover the plurality of pairs of the sources and the drains;
    forming a first photoresist layer on the passivation layer;
    patterning the first photoresist layer by a first photolithography to expose a plurality of portions of the passivation layer;
    forming first openings in the passivation layer by etching the exposed portions of the passivation layer, wherein the first openings are respectively located at first positions between the source and the drain of each pair;
    forming a second photoresist layer to cover the first openings and the passivation layer;
    patterning the second photoresist layer by a second photolithography to form second openings in the second photoresist layer, wherein the second openings are positioned at second positions between each pair of the sources and the drains;
    forming a metal layer to cover the second openings and the second photoresist layer, and
    lifting off the metal layer to form a plurality of gates of the transistors respectively in the second openings, wherein gate lengths of the transistors are controlled by fixing the second positions, at which the gates are formed, and adjusting the first positions, at which the first openings are etched.

10. The method of claim 9, wherein the transistors are III-V transistors.

11. The method of claim 9, wherein the gate lengths of the transistors are respectively determined by overlapping widths of the first openings and the second openings located in the transistors.

12. The method of claim 9, further comprising removing the first photoresist layer after forming the first openings.

13. The method of claim 12, wherein the first photoresist layer is removed by dry etching or wet stripping.

14. The method of claim 9, wherein the metal layer is lifted-off by removing the second photoresist layer.

15. The method of claim 9, wherein the first photolithography and the second photolithography are performed by a stepper.

\* \* \* \* \*